United States Patent [19]

Farina

[11] Patent Number: 4,885,475

[45] Date of Patent: Dec. 5, 1989

[54] PRECISION 50 PERCENT DUTY CYCLE CONTROLLER

[75] Inventor: Joseph P. Farina, Southwick, Mass.

[73] Assignee: United Technologies Corporation, Hartford, Conn.

[21] Appl. No.: 242,936

[22] Filed: Sep. 9, 1988

[51] Int. Cl.$^4$ .......................... H03K 5/00; H03K 5/22; H03K 5/08; H03F 3/45

[52] U.S. Cl. .................................. 307/261; 307/262; 307/265; 307/236; 307/494; 328/34; 328/62; 330/252; 323/312; 323/316

[58] Field of Search ................. 307/261, 262, 265, 236, 307/491, 494; 328/34, 62; 323/312, 316; 330/252

[56] References Cited

U.S. PATENT DOCUMENTS

| | | | |
|---|---|---|---|
| 3,172,952 | 3/1965 | Lentz | 307/262 |
| 3,188,486 | 6/1965 | Favin | 307/262 |
| 3,381,088 | 4/1968 | Lentz et al. | 307/261 |
| 4,034,236 | 7/1977 | Aveneau et al. | 307/262 |
| 4,052,679 | 10/1977 | Hosoya | 307/262 |
| 4,277,697 | 7/1981 | Hall et al. | 307/265 |
| 4,527,075 | 7/1985 | Zbinden | 307/265 |

Primary Examiner—Stanley D. Miller
Assistant Examiner—Trong Quang Phan
Attorney, Agent, or Firm—Francis J. Maguire, Jr.

[57] ABSTRACT

A sine wave locked in phase and frequency to a carrier having a high second harmonic content, carrying information on the magnitude of a parameter, is applied to an open loop operational amplifier which provides a trapezoidal waveform to a high speed, differential transistor pair which provides a pair of squarewave signals whose duty cycles are regulated by varying the threshold at which the differential pair switches. The squarewaves may be used as a second-harmonic-free demodualting signal. The fundamental premise is that if the amplitude levels of the squarewave levels of the squarewave are known to a high degree of accuracy, and they are equal in the positive and negative directions, then the average value is zero only for a 50% duty cycle. A current regulator generates a selected current to a constant value with a high gain amplifier. This current is switched from one side to the other of the differential pair by the trapezoidal waveform. The voltage excursions may be controlled in equal amounts above and below zero by selecting the resistive values in the collector circuits of the differential pair to be of a magnitude which will accomplish that end. The average value of the resulting squarewave is regulated to zero by integrating the voltage at the output of one of the collectors of the differential pair and varying the threshold at the base of the other transistor to obtain a 50% duty cycle.

1 Claim, 1 Drawing Sheet

PRECISION 50 PERCENT DUTY CYCLE CONTROLLER

Description

1. Technical Field

This invention relates to demodulation and, in particular, to a precision 50% duty cycle controller.

2. Background Art

For modulated signals having a high second harmonic content it is desirable to reject the unwanted components using a properly phase shifted chopper signal with no second harmonic as the baseband demodulation signal. A precision squarewave meets this requirement.

For example, in a serrodyne nulled fiber optic gyro, the signal being nulled is present along with a much larger second harmonic bias at twice the frequency of an AC carrier ("dithering") bias injected in the loop in order to reduce sensitivity to DC fluctuations.

Designs requiring a demodulator to reject second harmonics typically utilize "divide-by-two" schemes to create a precision 50% duty cycle. With "divide-by-two" techniques performance is limited to that of the rise and fall time capability of the divide-by-two circuit. This works fairly well, but the signal applied to the "divide-by-two" network must be derived using phase-locked-loop up-converter techniques. This necessarily introduces circuit complexities associated with such techniques.

DISCLOSURE OF THE INVENTION

The object of the present invention is to provide a precision 50% duty cycle controller.

According to the present invention, a sinusoidal reference wave at a frequency much less than a carrier frequency but referenced thereto is applied to an open loop operational amplifier which is overdriven thereby to provide a trapezoidal waveform to a high speed, differential transistor pair which provides a squarewave whose duty cycle is regulated at 50% by varying the threshold at which the differential pair switches. The squarewave is then used as a second-harmonic-free demodulating signal for demodulating a carrier predominated by the same second harmonic.

The fundamental premise is that if the amplitude levels of the squarewave are known to a high degree of accuracy, and they are equal in the positive and negative directions, then the average value is zero only for a 50% duty cycle.

A current regulator generates a selected current which is switched from one side to the other of the differential pair by the trapezoidal waveform. The voltage excursions are controlled in equal amounts above and below zero by selecting the resistive values in the collector circuits of the differential pair to be of a magnitude which will accomplish that end.

The average value of the resulting squarewave is regulated to zero by integrating the voltage at the output of one of the collectors of the differential pair and varying the threshold at the base of the other transistor to obtain a 50% duty cycle.

The present invention provides a closed loop regulation of the duty cycle that results in an absolute assurance of creating a 50% duty cycle for demodulation purposes.

These and other objects, features and advantage of the present invention will become more apparent in light of the following detailed description of a best mode embodiment thereof, as illustrated in the accompanying drawing.

BEST MODE FOR CARRYING OUT THE INVENTION

Figure 1:
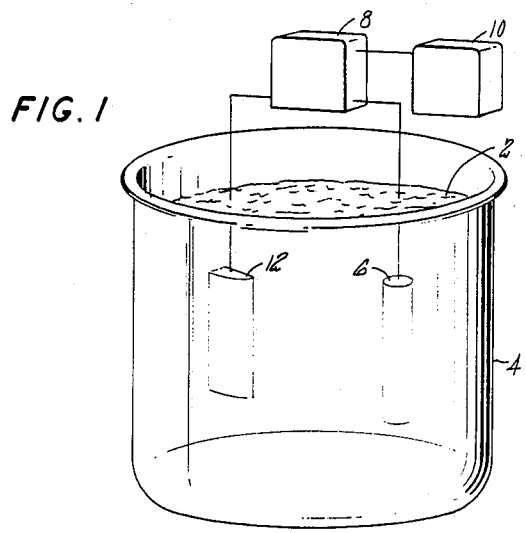
FIG. 1 is a simplified block diagram illustration of a precision demodulation circuit for use with a duty cycle controller, according to the present invention.

Referring first to FIG. 1, a demodulation circuit 10 for use by way of example and not limitation with a duty cycle controller, according to the present invention, is shown in simplified block diagram form. The demodulation circuit 10 is generally applicable to demodulation of any modulated signal but will be described in terms of a modulated signal on a line 12 being a modulated ("dithered") Sagnac phase shift signal from a fiber optic gyro. Such a signal has normally been modulated in order to reduce sensitivities to DC changes, such as the light source intensity. The signal on the line 12 must be demodulated and provided as a pure Sagnac phase shift signal on a line 14 which may then be amplified in an amplifier 16 and provided on a line 18 as an amplified, demodulated Sagnac phase shift output signal on line 18. Such a demodulated signal would normally be used to null the Sagnac phase shift in a manner known in the art.

The demodulation circuit 10, according to the present invention, comprises a mixer 20 responsive to a squarewave signal on a line 22 from a local oscillator 24 operating at a selected frequency, for example, slightly below, e.g., 10kHz below, the gyro dither frequency of, e.g., 500 kilohertz.

A reference signal on a line 26 has a frequency equal to the dither frequency, i.e., 500 kilohertz and in phase therewith, being derived from the same dither drive signal source (not shown) as that from which the dither carrier component of the signal on line 12 is ultimately derived. It also is mixed with the local oscillator output signal on the line 22 in a mixer 28.

The local oscillator 24 may comprise, for example, a divide-by-two circuit comprising, e.g., a D flip-flop responsive to a 980 kilohertz input at its clock port and having its not-Q output fed back to its D input while providing a 490 kilohertz output at its Q output port. The mixers 20, 28 may be, e.g., double balanced mixers made by Motorola, part no. MC1596 containing a standard Gilbert cell.

The mixer 28 provides an output signal on a line 30 which contains a wide spectrum of frequency components due to the mathematical multiplication of the signal on line 26 with the signal on line 22. The frequency components of interest are of course the difference frequency between the signal on the line 26 and the signal on the line 22 which, in the example, is 10 kilohertz. By passing the signal on the line 30 through a reference intermediate frequency amplifier, i.e., comprising an amplifier and filter which only passes the difference frequency and below, a signal at 10 kilohertz is provided on line 34 having an amplitude which provides a reference level proportional to the dither frequency. The low pass filter may comprise, e.g., a pair of LC filters for routing currents received from the mixer 28 to the differential inputs of, e.g., an instrumentation amplifier for providing the difference signal on line 34.

At the same time, the mixer 20 provides a signal on a line 36 representing the mathematical product of the signal on the line 22 with the signal on the line 12. The difference between the signal on the line 36 and the signal on the line 30 is that the signal on line 36 contains parameter information which must be extracted. This is done in the same way as in the reference leg, using an intermediate frequency amplifier and filter 38 which provides a signal on a line 40 containing a signal predominated by the difference frequency between the signal on line 22 and the signal on line 12. Its amplitude is proportional to both the AC carrier (dither) modulation, as in the signal on line 34, but also to the intelligence contained in the signal on line 12.

It is this intelligence which must be removed by a further mixer 42 which is responsive to a signal provided on a line 44 from a precision 50% duty cycle controller 46, as well as the signal on line 40. The mixer 42 may be comprised, e.g., of a Siliconix DMOS FET Quad Analog Switch Array. The function of the precision 50% duty cycle controller is to ensure that a signal on a line 48, which may be a phase compensated version of the signal on the line 34, is an exact 50% duty cycle squarewave. The signal on line 34 may be phase compensated, if necessary, to make up for any phase shifts which may exist in the sensing leg, by a phase shifting network 50.

The signal on line 40 and 44 are thus locked together in frequency and phase and produce a DC signal on the line 14 containing the low frequency information of the parameter being measured which in the fiber optic gyro example is low frequency angular rotation information.

Figure 2:
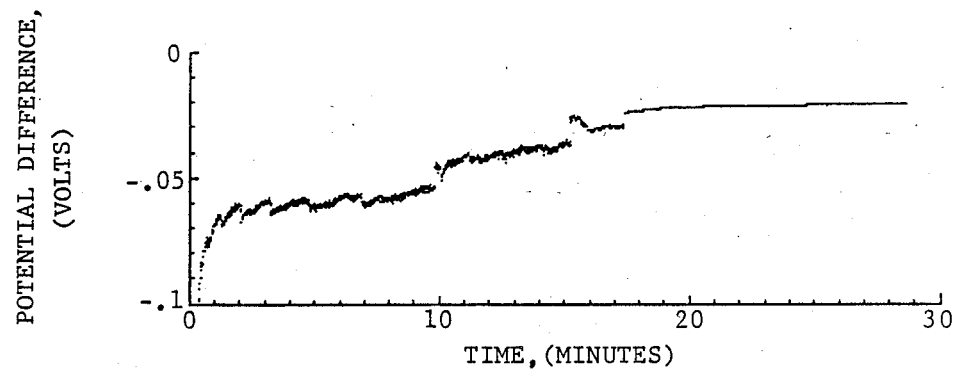
FIG. 2 is a simplified schematic diagram of a precision 50% duty cycle controller, according to the present invention.

FIG. 2 is an illustration of a precision 50% duty cycle controller which may be used to accomplish the function described in block 46 of FIG. 1.

The input signal 48 of FIG. 1 is shown in FIG. 2 as being provided to an overdriven amplifier 52 which produces a trapezoidal signal nearly equivalent to a squarewave except having less than a 90° slope on the rising and falling edges, on a line 54 to a transistor 56 being one half of a matched differential pair 56, 58. Each of the transistors is powered at its collector by $V_{cc}$ and has a precision 2R resistor in its collector circuit. The differential pair is a high speed device and is very responsive to the rising and falling edges of the trapezoidal waveform to cause transistor 56 to turn on and off thereby causing its counterpart 58 to turn off and on in alternation therewith. The amount of current flowing through each transistor in alternation is controlled by a regulator circuit 60 which controls a current (i) on a line 62 provided by either transistor 58, 56 at a level of $V_{cc}/R$ by regulating a node 64 to zero volts with a high gain amplifier 66. This current is mirrored by a dual transistor pair 68 which provides the same current to the differential pair 56, 58.

The voltage excursions due to switching the current on the line 62 from transistor 56 to transistor 58 as controlled by the trapezoidal signal on line 54 will be $2V_{cc}$, since the values of the collector resistors are exactly 2R.

The average value of the resulting squarewave is regulated to zero by integrating the voltage at a node 70 with an integrator 71 and varying the threshold at a node 72 to exactly obtain a 50% duty cycle. The fundamental premise is that if the amplitude levels of the squarewave are known to a high degree of accuracy, and they are equal in the positive and negative direction, then the average value is zero only for a 50% duty cycle.

Although the invention has been shown and described with respect to a best mode embodiment thereof, it should be understood by those skilled in the art that the foregoing and various other changes, omissions, and additions in the form and detail thereof maybe made therein without departing from the spirit and scope of the invention.

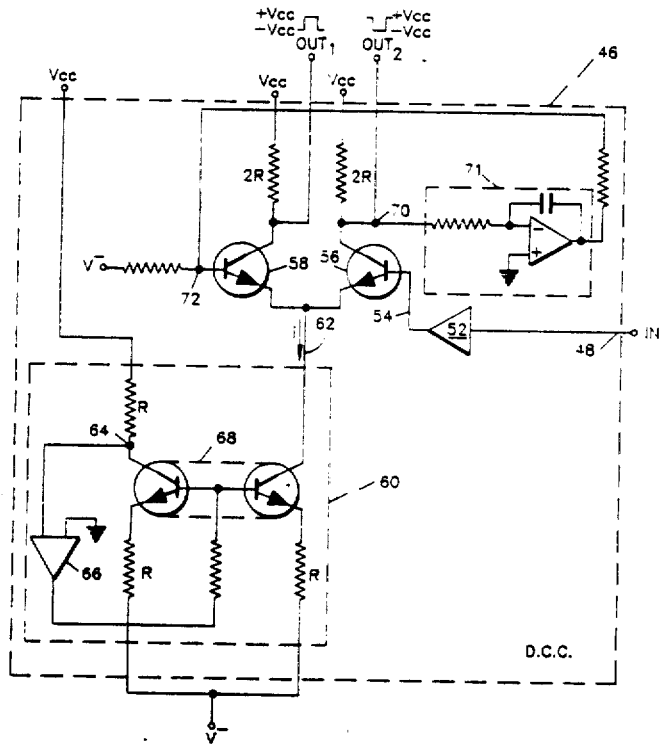

I claim:

1. A duty cycle controller, comprising:
    an amplifier, responsive to a sinusoidal signal, for providing a trapezoidal signal;
    a differential transistor pair having equal collector circuit resistances, responsive to a supply voltage and to said trapezoidal signal, for providing a current alternatively through each transistor of said differential pair and for providing square waves at said collectors;
    a current regulator, responsive to said current, for regulating said current in proportion to said supply voltage divided by half said collector resistance; and
    an integrator, responsive to a voltage on the collector of one of the transistors of said differential pair, for providing a signal to the base of the other one of said differential pair for regulating the average value of said square waves to zero.

* * * * *

UNITED STATES PATENT AND TRADEMARK OFFICE
CERTIFICATE OF CORRECTION

PATENT NO. : 4,885,475

DATED : December 5, 1989

INVENTOR(S) : Joseph P. Farina

It is certified that error appears in the above-identified patent and that said Letters Patent is hereby corrected as shown below:

IN THE ABSTRACT

Line 11, delete "levels of the squarewave", second occurrence.

The title page showing the illustrative figure should be deleted and substitute therefor the attached title page.

Figure 3:
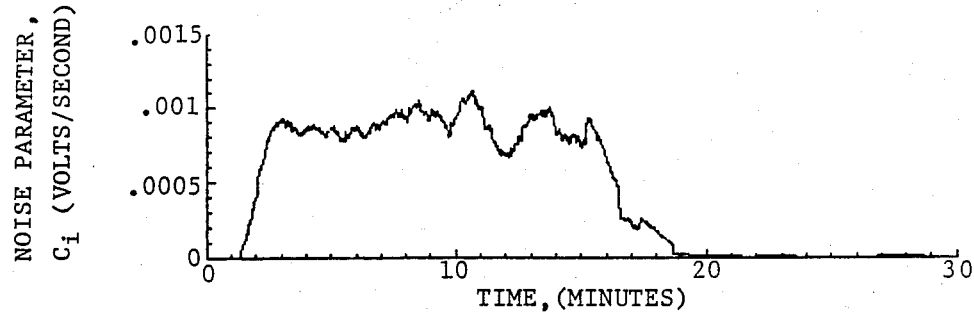
Figure 1:
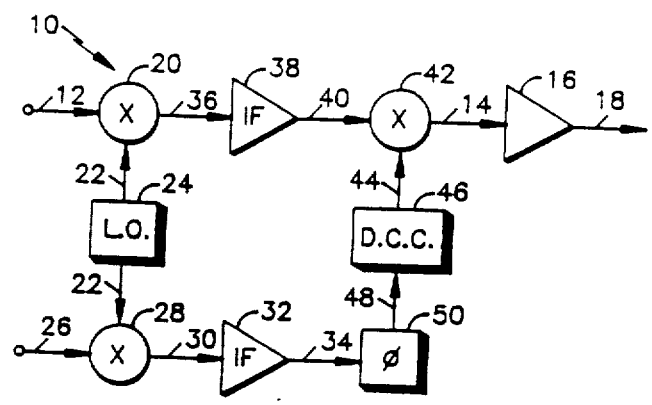
Figure 2:
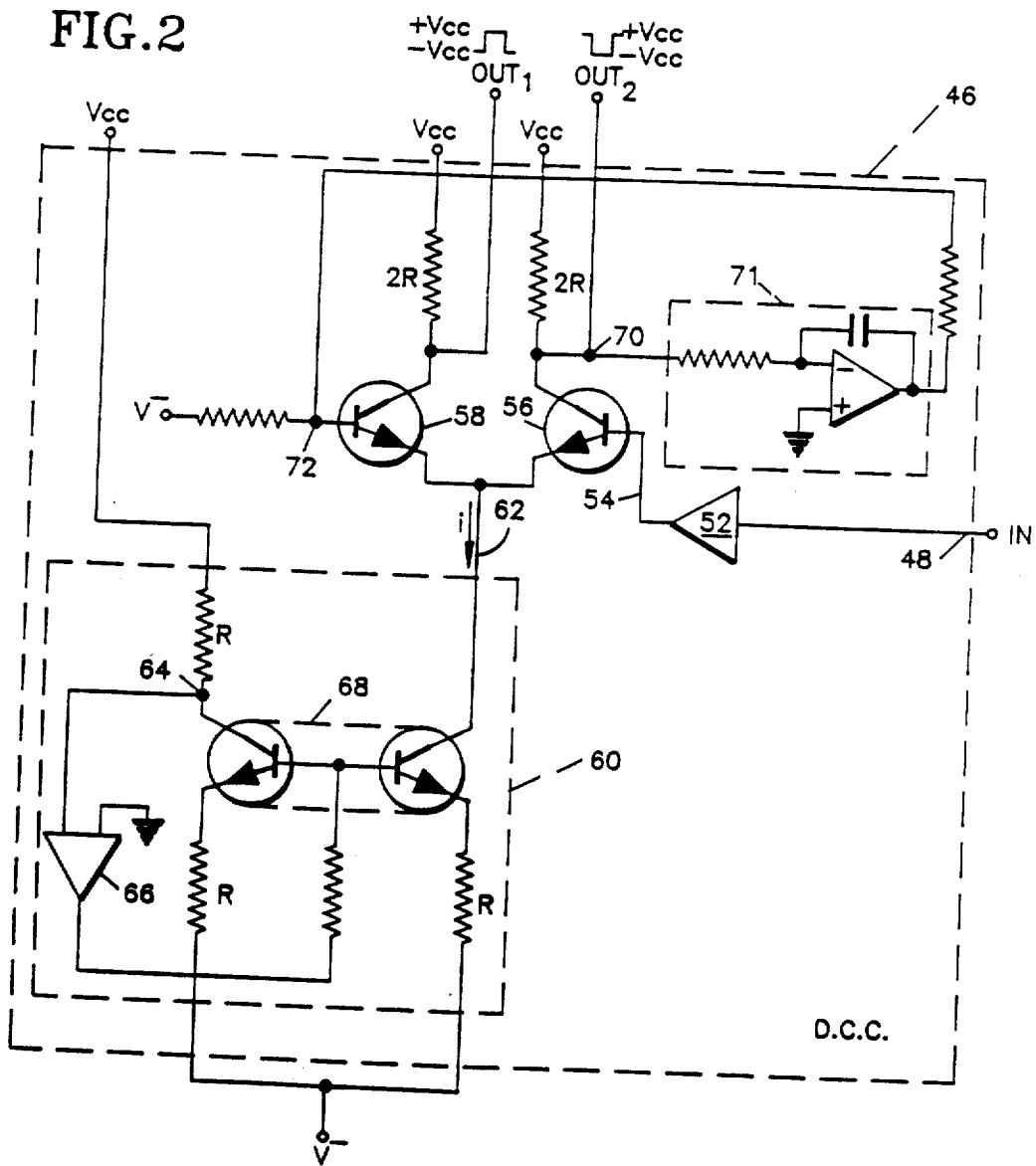

Sheet 1 of the drawings, consisting of Figs. 1-3, should be deleted to be replaced with the sheet of drawings, consisting of Figs. 1 and 2, as shown on the attached page.

Signed and Sealed this

Eleventh Day of February, 1992

Attest:

HARRY F. MANBECK, JR.

*Attesting Officer*      *Commissioner of Patents and Trademarks*

United States Patent [19]

Farina

[11] Patent Number: 4,885,475
[45] Date of Patent: Dec. 5, 1989

[54] PRECISION 50 PERCENT DUTY CYCLE CONTROLLER

[75] Inventor: Joseph P. Farina, Southwick, Mass.

[73] Assignee: United Technologies Corporation, Hartford, Conn.

[21] Appl. No.: 242,936

[22] Filed: Sep. 9, 1988

[51] Int. Cl.$^4$ .......................... H03K 5/00; H03K 5/22; H03K 5/08; H03F 3/45
[52] U.S. Cl. .................................... 307/261; 307/262; 307/265; 307/236; 307/494; 328/34; 328/62; 330/252; 323/312; 323/316
[58] Field of Search ............... 307/261, 262, 265, 236, 307/491, 494; 328/34, 62; 323/312, 316; 330/252

[56] References Cited

U.S. PATENT DOCUMENTS

| | | | |
|---|---|---|---|
| 3,172,952 | 3/1965 | Lentz | 307/262 |
| 3,188,486 | 6/1965 | Favin | 307/262 |
| 3,381,088 | 4/1968 | Lentz et al. | 307/261 |
| 4,034,236 | 7/1977 | Aveneau et al. | 307/262 |
| 4,052,679 | 10/1977 | Hosoya | 307/262 |
| 4,277,697 | 7/1981 | Hall et al. | 307/265 |
| 4,527,075 | 7/1985 | Zbinden | 307/265 |

Primary Examiner—Stanley D. Miller
Assistant Examiner—Trong Quang Phan
Attorney, Agent, or Firm—Francis J. Maguire, Jr.

[57] ABSTRACT

A sine wave locked in phase and frequency to a carrier having a high second harmonic content, carrying information on the magnitude of a parameter, is applied to an open loop operational amplifier which provides a trapezoidal waveform to a high speed, differential transistor pair which provides a pair of squarewave signals whose duty cycles are regulated by varying the threshold at which the differential pair switches. The squarewaves may be used as a second-harmonic-free demodualting signal. The fundamental premise is that if the amplitude levels of the squarewave levels of the squarewave are known to a high degree of accuracy, and they are equal in the positive and negative directions, then the average value is zero only for a 50% duty cycle. A current regulator generates a selected current to a constant value with a high gain amplifier. This current is switched from one side to the other of the differential pair by the trapezoidal waveform. The voltage excursions may be controlled in equal amounts above and below zero by selecting the resistive values in the collector circuits of the differential pair to be of a magnitude which will accomplish that end. The average value of the resulting squarewave is regulated to zero by integrating the voltage at the output of one of the collectors of the differential pair and varying the threshold at the base of the other transistor to obtain a 50% duty cycle.

1 Claim, 1 Drawing Sheet